United States Patent
Shenouda et al.

(10) Patent No.: US 12,196,820 B2
(45) Date of Patent: Jan. 14, 2025

(54) DETECTING DAMAGE TO ELECTRIC CONDUCTOR USING ELECTROMAGNETIC RADIATION

(71) Applicant: Pratt & Whitney Canada Corp., Longueuil (CA)

(72) Inventors: Antwan Shenouda, Mississauga (CA); Michael P. Smith, Mississauga (CA)

(73) Assignee: PRATT & WHITNEY CANADA CORP., Québec (CA)

( * ) Notice: Subject to any disclaimer, the term of this patent is extended or adjusted under 35 U.S.C. 154(b) by 5 days.

(21) Appl. No.: 17/712,099

(22) Filed: Apr. 2, 2022

(65) Prior Publication Data

US 2023/0314533 A1    Oct. 5, 2023

(51) Int. Cl.
*G01R 31/58* (2020.01)

(52) U.S. Cl.
CPC .................... *G01R 31/58* (2020.01)

(58) Field of Classification Search
CPC ................................... G01R 31/58
See application file for complete search history.

(56) References Cited

U.S. PATENT DOCUMENTS

| | | | |
|---|---|---|---|
| 6,559,437 B1 * | 5/2003 | Pope, Jr. | H01B 7/328 250/227.14 |
| 7,142,291 B2 | 11/2006 | Sarkozi | |
| 10,871,403 B1 * | 12/2020 | Simpson | G01K 7/06 |
| 10,928,435 B2 | 2/2021 | Severns | |
| 2005/0134837 A1 | 6/2005 | Sarkozi et al. | |
| 2007/0023618 A1 * | 2/2007 | Viehmann | H01H 9/50 250/227.11 |
| 2009/0102489 A1 | 4/2009 | Lee et al. | |
| 2016/0139196 A1 * | 5/2016 | Hoff | G01R 31/1218 356/73.1 |
| 2018/0224617 A1 * | 8/2018 | Lee | G02B 6/443 |
| 2019/0278038 A1 * | 9/2019 | Kamath | G02B 6/4416 |
| 2021/0118635 A1 | 4/2021 | Payne | |

FOREIGN PATENT DOCUMENTS

| | | |
|---|---|---|
| EP | 3951456 A1 | 2/2022 |
| JP | H02269980 A | 11/1990 |
| JP | 2019113596 A * | 7/2019 |
| KR | 20070104327 A * | 10/2007 |

OTHER PUBLICATIONS

"36 Volts ZVS driver arcing in transformer oil", Oct. 17, 2012, https://www.youtube.com/watch?v=8G9fkRtUf2Y.

(Continued)

*Primary Examiner* — Feba Pothen
(74) *Attorney, Agent, or Firm* — CANTOR COLBURN LLP

(57) ABSTRACT

An electric apparatus is provided that includes a fiber optic system and an electric conductor. The fiber optic system includes an inner cladding, an outer cladding and a fiber optic core between the inner cladding and the outer cladding. The electric conductor extends longitudinally along a centerline within the fiber optic system. The centerline may be a centerline of any one or more or all of the fiber optic system, the inner cladding, the outer cladding, the fiber optic core and/or the electric conductor.

16 Claims, 10 Drawing Sheets

(56) References Cited

OTHER PUBLICATIONS

Beurden, "Electrical Treeing and Breakdown of Acrylic Glass Insulation Dual Tree Growth" Dec. 3, 2012, https://www.youtube.com/watch?v=Dq2xQb982vl.

Cooke, "High Impedance Arc Fault Detection in a Manhole Environment", Electronic Theses and Dissertations, paper 1767, 2010, https://dc.etsu.edu/cgi/viewcontent.cgi?article=3122&context=etd.

Qualitrol, "What is Partial Discharge (PD) and what are the different types of Partial Discharges in power cables?" Oct. 1, 2020, https://www.qualitrolcorp.com/home-2/power-cable-partial discharge/.

Quora, "What is the difference between partial discharge and corona?", 2017, https://www.quora.com/What-is-the-difference-between-partial-discharge-and-corona.

Ramesh et al. "Investigation Into Effects of Corona on Insulators", International Journal of Engineering Research & Technology, vol. 6, issue 15, 2018.

Wikipedia, "Electrical Breakdown", Mar. 8, 2022, https://en.wikipedia.org/wiki/Electrical_breakdown.

Wikipedia, "Partial Discharge", Aug. 27, 2021, https://en.wikipedia.org/wiki/Partial_discharge.

Search Report issued in European Patent Application No. 23164831.2; Application Filing Date Mar. 28, 2023; Date of Mailing Aug. 22, 2023 (10 pages).

\* cited by examiner

DETECTING DAMAGE TO ELECTRIC CONDUCTOR USING ELECTROMAGNETIC RADIATION

TECHNICAL FIELD

This disclosure relates generally to an electric conductor and, more particularly, to detecting damage to the electric conductor.

BACKGROUND INFORMATION

Various systems including aircraft systems include one or more electric conductors for transferring electric power and/or electric signals. Insulation around an electric conductor may become damaged allowing electricity to arc between the electric conductor and another conductive element. This electric arcing may diminish or prevent proper operation of electric components coupled to the electric conductor. The electric arcing may also subject the system to a fire hazard. Various systems and methods are known in the art for detecting an electric arc. While these known systems and methods have various benefits, there is still room in the art for improvement.

SUMMARY

According to an aspect of the present disclosure, an electric apparatus is provided that includes a fiber optic system and an electric conductor. The fiber optic system includes an inner cladding, an outer cladding and a fiber optic core between the inner cladding and the outer cladding. The electric conductor extends longitudinally along a centerline within the fiber optic system. The centerline may be a centerline of any one or more or all of the fiber optic system, the inner cladding, the outer cladding, the fiber optic core and/or the electric conductor.

According to another aspect of the present disclosure, another electric apparatus is provided that includes an electric conductor and a fiber optic system. The electric conductor extends longitudinally along a centerline. The fiber optic system includes a fiber optic core and cladding between the fiber optic core and the electric conductor. The cladding extends longitudinally along and circumferentially around the electric conductor. The centerline may be a centerline of any one or more or all of the electric conductor, the fiber optic system, the fiber optic core and/or the cladding.

According to still another aspect of the present disclosure, another electric apparatus is provided that includes an electric winding. The electric winding includes an electric conductor and a fiber optic core. The electric conductor extends longitudinally along a centerline with a spiral geometry. The fiber optic core extends longitudinally along the electric conductor.

The electric apparatus may also include a sensor and a monitor in communication with the sensor. The sensor may be configured to detect electromagnetic radiation traveling through the fiber optic core, where the electromagnetic radiation may be generated by an electric arc with the electric conductor. The monitor may be configured to detect the electric arc based on detection of the electromagnetic radiation by the sensor.

The electric winding may also include insulation extending longitudinally along the fiber optic core. The insulation may be between the fiber optic core and the electric conductor.

The electric conductor may include a first conductor portion and a second conductor portion longitudinally overlapping the first conductor portion. The fiber optic core may include a first core portion between and longitudinally overlapping the first conductor portion and the second conductor portion.

The fiber optic system may extend longitudinally along and circumferentially around the electric conductor.

The inner cladding may extend longitudinally along and circumferentially around the electric conductor. The fiber optic core may extend longitudinally along and circumferentially around the inner cladding. The outer cladding may extend longitudinally along and circumferentially around the fiber optic core.

The inner cladding may be between the electric conductor and the fiber optic core.

The electric conductor may have a circular cross-sectional geometry perpendicular to the centerline.

The electric conductor may have a non-circular cross-sectional geometry perpendicular to the centerline.

The electric apparatus may also include insulation extending longitudinally along and circumferentially around the fiber optic system.

The electric apparatus may also include insulation extending longitudinally along and circumferentially around the electric conductor. The insulation may be between the electric conductor and the fiber optic system.

The electric apparatus may also include a second electric conductor extending longitudinally within the fiber optic system.

The inner cladding may extend longitudinally along and circumferentially around the electric conductor. The fiber optic system may also include a second inner cladding. The second inner cladding may extend longitudinally along and circumferentially around the second electric conductor.

The electric apparatus may also include a sensor configured to detect electromagnetic radiation traveling through the fiber optic core.

The electric apparatus may also include a monitor in communication with the sensor. The monitor may be configured to detect an electric arc with the electric conductor based on detection of the electromagnetic radiation by the sensor. The electromagnetic radiation may be generated by the electric arc.

The fiber optic core may include a tubular base, a lead and a transition that tapers from the tubular base to the lead. The sensor may be optically coupled to the fiber optic core through the lead.

The electric apparatus may also include a first electric device and a second electric device electrically coupled to the first electric device through the electric conductor.

The electric apparatus may also include an electric winding. The electric winding may include the electric conductor.

The centerline may be a centerline the fiber optic system.
The centerline may be a centerline the cladding.
The centerline may be a centerline the inner cladding.
The centerline may be a centerline the outer cladding.
The centerline may be a centerline the fiber optic core.
The centerline may be a centerline the electric conductor.

The present disclosure may include any one or more of the individual features disclosed above and/or below alone or in any combination thereof.

The foregoing features and the operation of the invention will become more apparent in light of the following description and the accompanying drawings.

DETAILED DESCRIPTION

Figure 1:
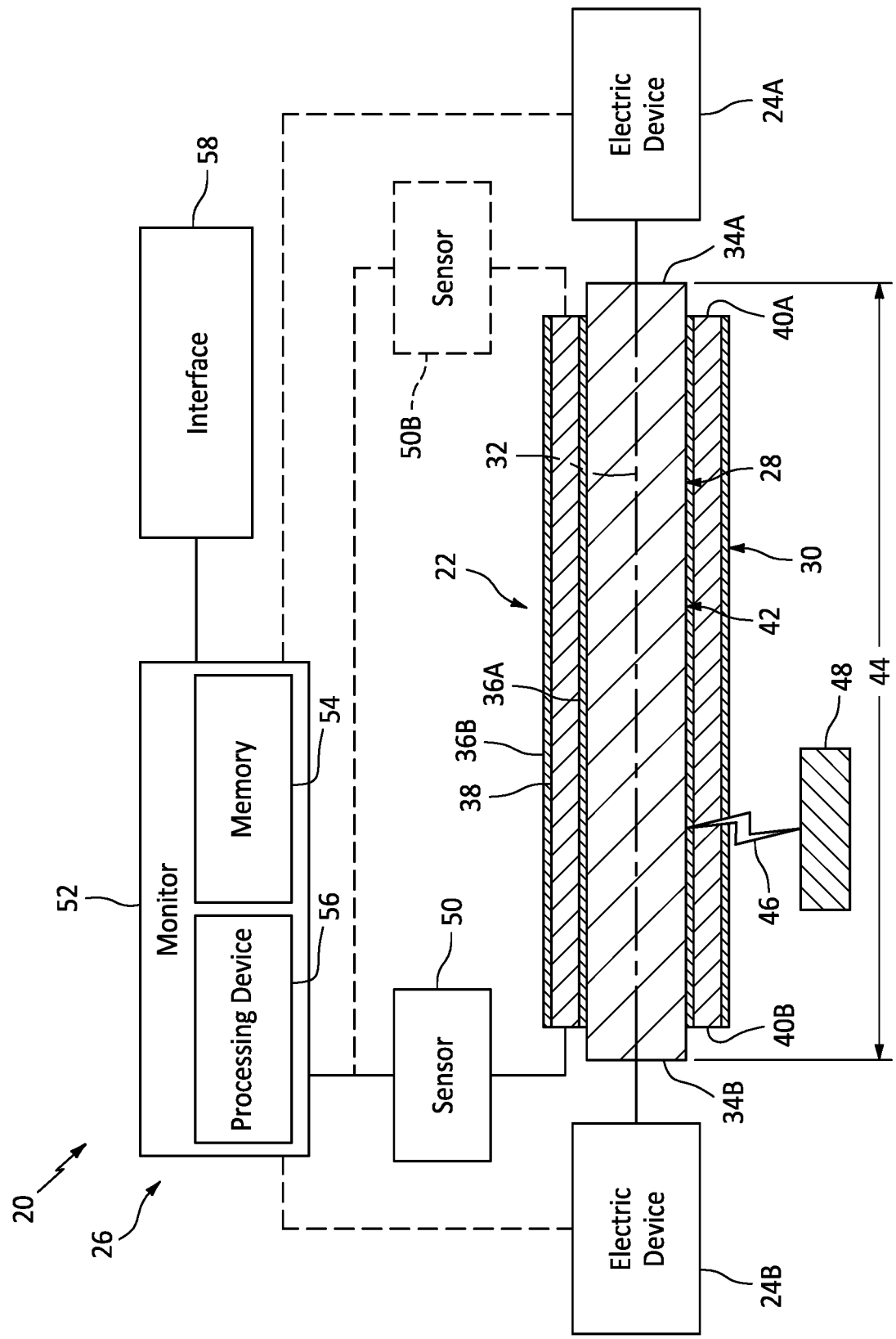
FIG. 1 is a schematic illustration of an electric apparatus for a powerplant.

FIG. 1 is a schematic illustration of an electric apparatus 20 for a powerplant. The powerplant may be configured as or otherwise include a gas turbine engine, a piston engine, a rotary engine or any other type of heat engine. Examples of the gas turbine engine include, but are not limited to, a turbofan engine, a turboprop engine and a turboshaft engine. The powerplant may be configured as or otherwise included in an aircraft propulsion system for propelling an aircraft or another mobile apparatus. The powerplant may also or alternatively be configured as or otherwise included in a power generation system for generating electrical power. The present disclosure, however, is not limited to the foregoing powerplant types or configurations, nor to powerplant applications. The electric apparatus 20, for example, may also or alternatively be configured for an electric grid or any other electric device or system.

The electric apparatus 20 of FIG. 1 includes an electric cable 22, one or more electric devices 24A and 24B (generally referred to as "24") and a cable monitoring system 26. The electric cable 22 includes an electric conductor 28 and a fiber optic system 30.

Figure 2:
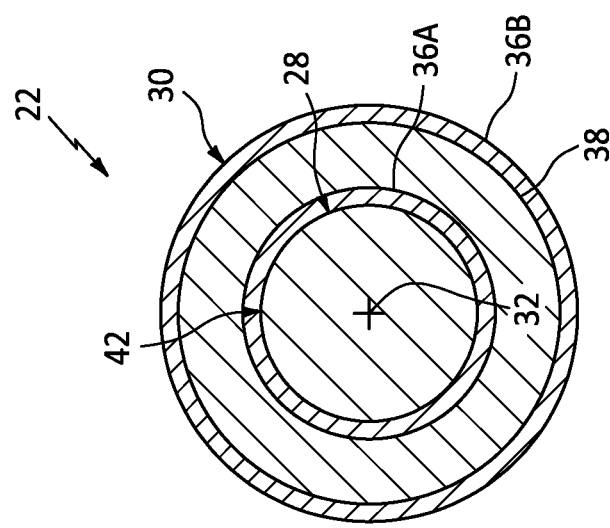
FIG. 2 is a cross-sectional illustration of an electric cable with a circular geometry.

The electric conductor 28 extends longitudinally along a longitudinal centerline 32 within the fiber optic system 30 between and to opposing longitudinal ends 34A and 34B (generally referred to as "34") of the electric conductor 28. The longitudinal centerline 32 may be a centerline of the electric conductor 28 and/or a centerline of the electric cable 22. Referring to FIG. 2, the electric conductor 28 may have a circular cross-sectional geometry when viewed, for example, in a reference plane perpendicular to the longitudinal centerline 32. Alternatively, referring to FIG. 3, the electric conductor 28 may have a non-circular cross-sectional geometry when viewed, for example, in the reference plane. Examples of the non-circular geometry include, but are not limited to, an elongated cross-sectional geometry and a polygonal cross-sectional geometry. Examples of the elongated cross-sectional geometry include, but are not limited to, a race-track (e.g., oval track) shaped cross-sectional geometry, an oval cross-sectional geometry and an elliptical cross-sectional geometry. The electric conductor 28 of the present disclosure, however, is not limited to the foregoing exemplary cross-sectional geometries.

Referring to FIG. 1, the electric conductor 28 is configured from or otherwise includes an electrically conductive material. The electric conductor 28, for example, may be constructed from a metal such as, but not limited to, copper (Cu), aluminum (Al), iron (Fe), or an alloy thereof. In another example, the electric conductor 28 may be constructed from a superconductive material such as, but not limited to, graphene. The electric conductor 28 of the present disclosure, however, is not limited to the foregoing exemplary electrically conductive materials.

The fiber optic system 30 may be configured as a sheath for the electric conductor 28. The fiber optic system 30 of FIGS. 1 and 2, for example, extends longitudinally along and circumferentially surrounds at least a portion of the electric conductor 28. This fiber optic system 30 of FIGS. 1 and 2 includes one or more (e.g., tubular) claddings 36A and 36B (generally referred to as "36") and a (e.g., tubular) fiber optic core 38.

Referring to FIG. 1, the fiber optic system 30 and one or more or each of its system elements 36A, 36B and 38 extends longitudinally along the electric conductor 28 and the longitudinal centerline 32 between and to opposing longitudinal ends 40A and 40B (generally referred to as "40") of the fiber optic system 30, which longitudinal centerline 32 may also (or alternatively) be a centerline of one or more or each of the system elements 36A, 36B and 38. The first optic system end 40A may be longitudinally setback (e.g., offset, recessed) from the first conductor end 34A. The second optic system end 40B may be longitudinally setback (e.g., offset, recessed) from the second conductor end 34B. The fiber optic system 30 of FIG. 1 and its system element(s) 36A, 36B and 38 may thereby longitudinally cover (e.g., sheath) an intermediate segment 42 of the electric conductor 28. However, this intermediate segment 42 may account for a majority of a longitudinal length 44 of the electric conductor 28. The fiber optic system 30 and its system element(s) 36A, 36B and 38, for example, may extend longitudinally along and/or cover at least sixty percent (60%) of the conductor length 44; e.g., between seventy-fiver percent (75%) and ninety-five percent (95%) of the conductor length 44. The present disclosure, however, is not limited to the foregoing dimensional relationship between the fiber optic system 30 and the electric conductor 28. For example, in other embodiments, the fiber optic system 30 and its system element(s) 36A, 36B and 38 may extend longitudinally along and/or cover an entirety of the electric conductor 28 and its conductor length 44, or less than sixty percent (60%) of the electric conductor 28 and its conductor length 44.

Referring to FIG. 2, the fiber optic system 30 and one or more or each of its system elements 36A, 36B and 38 extends circumferentially about (e.g., completely around) the electric conductor 28. The inner cladding 36A of FIG. 2, for example, extends circumferentially around the electric conductor 28. This inner cladding 36A is radially adjacent and may contact the electric conductor 28. The fiber optic core 38 of FIG. 2 extends circumferentially around the inner cladding 36A and the electric conductor 28. This fiber optic core 38 is radially adjacent and may contact the inner cladding 36A. The outer cladding 36B of FIG. 2 extends circumferentially around the fiber optic core 38, the inner cladding 36A and the electric conductor 28. This outer cladding 36B is radially adjacent and may contact the fiber optic core 38. With the foregoing arrangement, the inner cladding 36A may provide a radial buffer between the electric conductor 28 and the fiber optic core 38. The outer cladding 36B may provide a radial buffer between the fiber optic core 38 and an external environment within/through which the electric cable 22 extends.

The inner cladding 36A is configured to provide an inner reflective boundary for the fiber optic core 38. The outer cladding 36B is configured to provide an outer reflective boundary for the fiber optic core 38. The inner cladding 36A and the outer cladding 36B, for example, may be configured from or otherwise include cladding material; e.g., electromagnetic radiation reflective material. The inner and the outer claddings 36 of the present disclosure, however, are not limited to the foregoing exemplary cladding materials.

The fiber optic core 38 is configured to transmit electromagnetic (EM) radiation (e.g., visible light, ultraviolet (UV) radiation, infrared (IR) radiation, etc.) along a longitudinal length of the fiber optic system 30. The fiber optic core 38, for example, may be configured from or otherwise include an electrically non-conductive (e.g., insulating), electromagnetic radiation transparent (e.g., clear) material. For example, the fiber optic core 38 may be constructed from a clear composite (e.g., glass) or a clear polymer (e.g., acrylic or plastic). The fiber optic core 38 of the present disclosure, however, is not limited to the foregoing exemplary electrically non-conductive, electromagnetic radiation transparent materials.

Referring to FIG. 1, each of the electric devices 24 is electrically coupled with the electric cable 22 and, more particularly, the electric conductor 28. The first electric device 24A of FIG. 1, for example, is electrically coupled to the first conductor end 34A. The second electric device 24B is electrically coupled to the second conductor end 34B. These electric couplings may be direct couplings or indirect couplings through one or more intermediate electric conductors; e.g., connector(s), harness(es), additional wire(s), etc.

The electric devices 24 are configured to transfer electricity therebetween through the electric cable 22 and its electric conductor 28. This transfer of electricity may be for electrical power transfer and/or signal communication. The first electric device 24A, for example, may be configured as or otherwise include an electrical power source; e.g., a battery, a generator, etc. The second electric device 24B may be configured as or otherwise include an electrical power sink; e.g., a motor, an actuator, a computer system such as a controller, etc. With such an arrangement, the first electric device 24A is configured to transfer the electrical power to the second electric device 24B through the electric conductor 28. The electrical power may be of high or low voltage depending on electrical requirements of the second electric device 24B. Of course, the first electric device 24A may also or alternatively be configured as or otherwise include a transmitter and the second electric device 24B may be configured as or otherwise include a receiver (or vice versa). With such an arrangement, the first electric device 24A is configured to communicate with (e.g., transmit an electrical signal to) the second electric device 24B through the electric conductor 28.

The cable monitoring system 26 is configured to detect damage to the electric cable 22. The cable monitoring system 26, for example, is configured to detect presence of an electric arc 46 (schematically shown) between the electric conductor 28 and another nearby conductive element 48 (or another portion of the electric conductor 28). Electricity may arc between the electric conductor 28 and the conductive element 48 (or the other portion of the electric conductor 28) where, for example, material surrounding (e.g., insulating) the electric conductor 28 is degraded; e.g., cracked, fractured, worn, etc. Such electric arcing may lead to inefficient operation, improper operation and/or inoperability of the electric device(s) 24A and/or 24B. The electric arcing may also or alternatively cause a hazard (e.g., a fire hazard, shorting hazard, etc.) to the electric apparatus 20 and/or other components of the powerplant. The cable monitoring system 26 of FIG. 1 includes an electromagnetic radiation sensor 50 (e.g., an optical sensor) and a monitor 52.

The sensor 50 is configured to sense electromagnetic radiation (e.g., light) traveling through the fiber optic core 38. This electromagnetic radiation may be generated by the electric arcing between the electric conductor 28 and the conductive element 48 (or the other portion of the electric conductor 28). The sensor 50 is also configured to provide sensor data indicative of the sensed electromagnetic radiation. The sensor 50, for example, may be configured as or otherwise include an optical sensor (e.g., a light receptor), an ultraviolet (UV) light sensor, an infrared (IR) light sensor, or a wide spectrum sensor. However, various other types and configurations of electromagnetic radiation sensors are known in the art, and the present disclosure is not limited to any particular types or configurations thereof.

The sensor 50 of FIG. 1 is optically coupled to one of the optic system ends 40. The sensor 50 of FIG. 1, for example, is optically coupled to the second optic system end 40B. However, in other embodiments, the sensor 50 (or an additional sensor 50B) may be optically coupled to the first optic system end 40A. The optical coupling between the sensor 50 (or the additional sensor 50B) and the fiber optic core 38 may be a direct coupling or an indirect coupling through one or more intermediate optical elements; e.g., connector(s), fiber optic line(s), etc.

The monitor 52 is configured in signal communication (e.g., hardwired and/or wirelessly coupled) with the one or more sensors 50, 50B. This monitor 52 may be implemented with a combination of hardware and software. The hardware may include memory 54 and at least one processing device 56, where the processing device 56 may include one or more single-core and/or multi-core processors. The hardware may also or alternatively include analog and/or digital circuitry other than that described above.

The memory 54 is configured to store software (e.g., program instructions) for execution by the processing device 56, which software execution may control and/or facilitate performance of one or more operations such as those described below. The memory 54 may be a non-transitory computer readable medium. For example, the memory 54 may be configured as or include a volatile memory and/or a nonvolatile memory. Examples of a volatile memory may include a random access memory (RAM) such as a dynamic random access memory (DRAM), a static random access memory (SRAM), a synchronous dynamic random access memory (SDRAM), a video random access memory (VRAM), etc. Examples of a nonvolatile memory may include a read only memory (ROM), an electrically erasable programmable read-only memory (EEPROM), a computer hard drive, etc.

Figure 4:
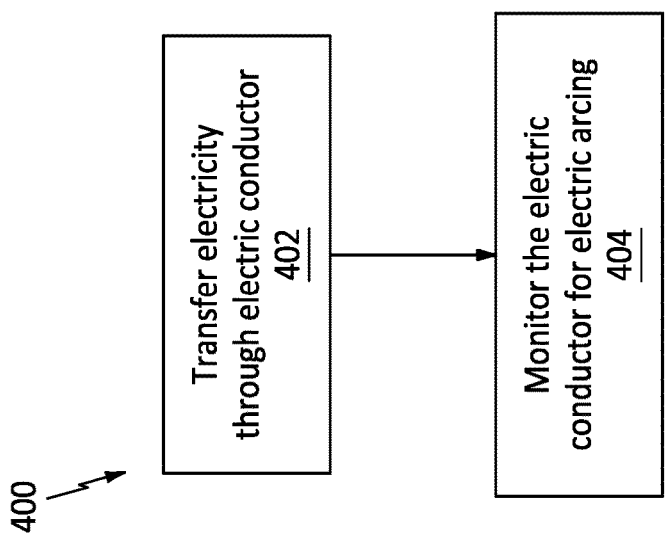
FIG. 4 is a flow diagram of a method for detecting electric arcing.

FIG. 4 is a flow diagram of a method 400 for detecting electric arcing. For ease of description, the detection method 400 is described below with reference to the electric apparatus 20 described above. The detection method 400 of the present disclosure, however, is not limited to any particular electric apparatus configurations. The detection method 400, for example, may also be performed with any of the electric apparatus configurations described below.

In step 402, electricity is transferred between the electric devices 24. The first electric device 24A, for example, may transfer electrical power and/or an electric signal to the second electric device 24B through the electric cable 22 and its electric conductor 28.

Under certain circumstances (e.g., following damage and/or degradation to at least some of the material surrounding the electric conductor 28), at least a portion of the transferred electricity may continuously, periodically or momentarily arc from the electric conductor 28 to the conductive element 48 (or the other portion of the electric conductor 28). This electrical arc 46 may generate electromagnetic radiation (e.g., light, etc.). Some of this electromagnetic radiation may enter the fiber optic core 38, and may travel within the fiber optic core 38 towards/to the sensor 50. Such electromagnetic radiation may be generated by both low impedance and high impedance arcs.

In step 404, the electric cable 22 is monitored for electric arcing. The sensor 50, for example, provides the sensor data to the monitor 52. The monitor 52 processes the sensor data to determine whether any electromagnetic radiation (or a predetermined frequency or frequency range of electromagnetic radiation) was detected (e.g., sensed) by the sensor 50. Where the sensor data includes information indicating the sensor 50 detected electromagnetic radiation (or the predetermined frequency or frequency range of electromagnetic radiation), the monitor 52 may determine electrical arcing is present along at least a portion of the conductor length 44 and, thus, the electric cable 22 is damaged. Where electric arcing/damage is detected, the monitor 52 may signal an interface 58 (e.g., a user interface) to provide an alert to personnel operating the powerplant; e.g., a pilot. The monitor 52 may also or alternatively signal the first electric device 24A to terminate its transfer of electricity to the second electric device 24B through the electric cable 22 and its electric conductor 28. However, where the sensor data does not include information indicating the sensor 50 detected electromagnetic radiation (or the predetermined frequency or frequency range of electromagnetic radiation), the monitor 52 may determine electric arcing is not present and, thus, the electric cable 22 is not damaged.

Electromagnetic radiation can travel relatively fast through the fiber optic core 38. The cable monitoring system 26 may thereby quickly detect an electric arc 46/damage to the electric cable 22 and facilitate a quick response to the electric arc detection. Furthermore, propagation of the electromagnetic radiation through the fiber optic core 38 may be impervious to various outside influences such as, for example, noise, vibrations, outside electromagnetic radiation sources, etc.

In some embodiments, in addition to detecting the electric arc 46/the damage to the electric cable 22, the monitor 52 may also determine information regarding the electric arc 46/the damage. This additional information may include, but is not limited to, a severity of the electric arc 46 and/or a location of the electric arc 46. The additional information may be determined based on one or more parameters determined from and/or included in the sensor data. These parameters may be indicative of, but are not limited to: intensity of the electromagnetic radiation; an intensity rise rate of the electromagnetic radiation; a frequency spectrum of the electromagnetic radiation; a wavelength spectrum of the electromagnetic radiation; a duration of the electromagnetic radiation; a rise time of the electromagnetic radiation; and/or a frequency of occurrence of the electromagnetic radiation.

Figure 5A:
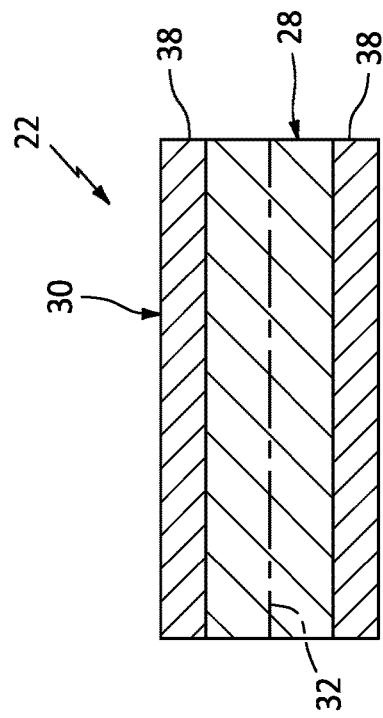
FIG. 5A-C are sectional illustrations of a portion of the electric cable with various fiber optic cladding configurations.
Figure 5B:
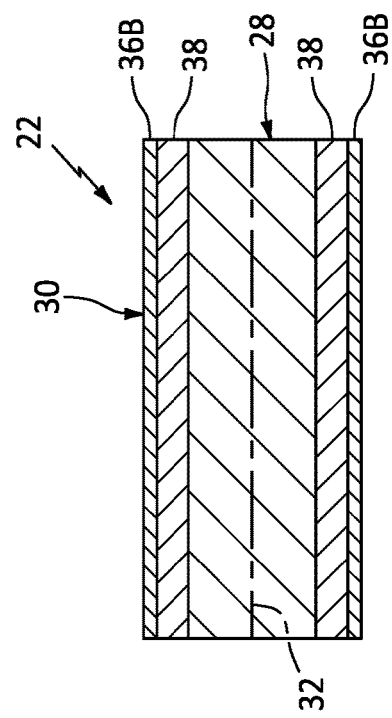
Figure 5C:
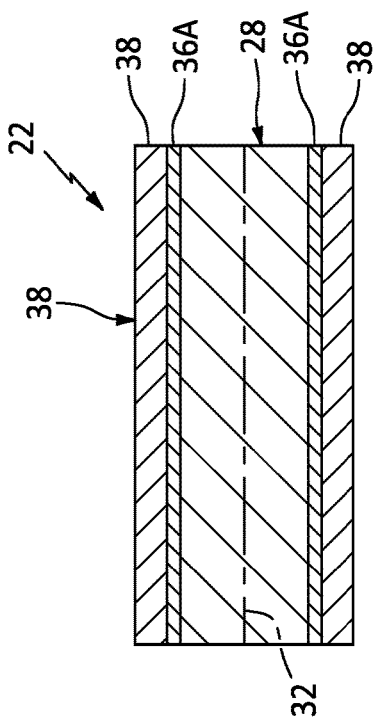

In some embodiments, referring to FIGS. 5A, 5B and 5C, the optic fiber system 22 may be configured without one or more of the claddings 36A and/or 36B. These claddings 36 may be omitted where, for example, the electric cable 22 is in a dark (e.g., pitch black, low ambient light, etc.) environment and/or the length of the fiber optic core 38 is relatively short. For example, referring to FIGS. 5A and 5B, the optic fiber system 22 may be configured without the inner cladding 36A. The fiber optic core 38 may thereby contact the electric conductor 28 (or insulation surrounding the electric conductor 28). Referring to FIGS. 5A and 5C, the optic fiber system 22 may also or alternatively be configured without the outer cladding 36B. The fiber optic core 38 may thereby be exposed to the external environment (or contact insulation surrounding the fiber optic system 30).

Figure 3:
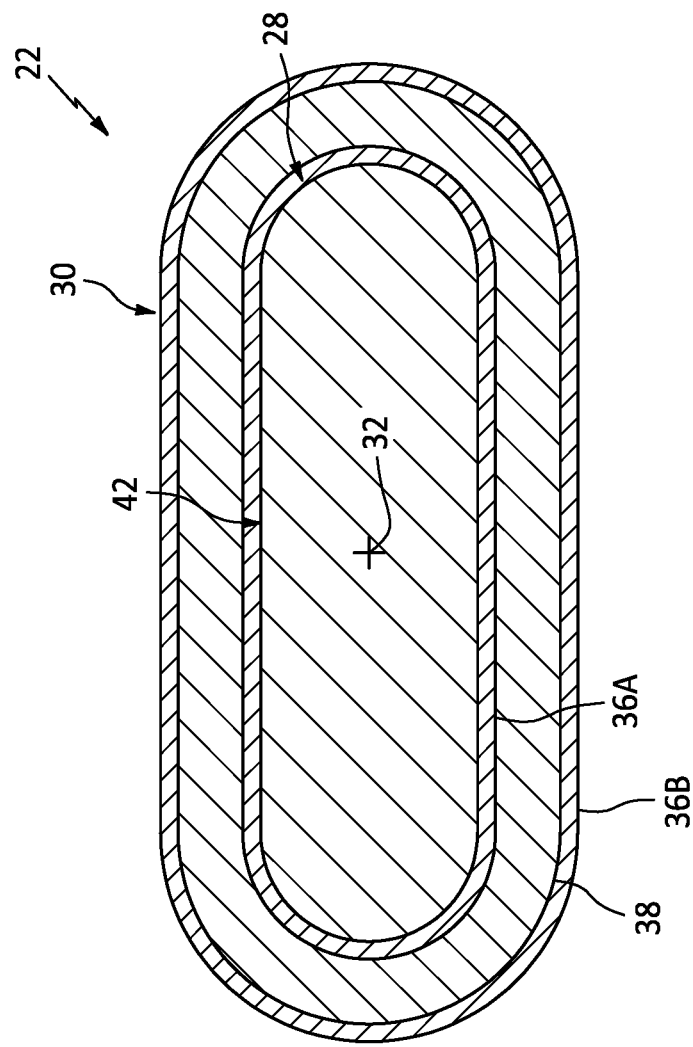
FIG. 3 is a cross-sectional illustration of the electric cable with a non-circular geometry.
Figure 6A:
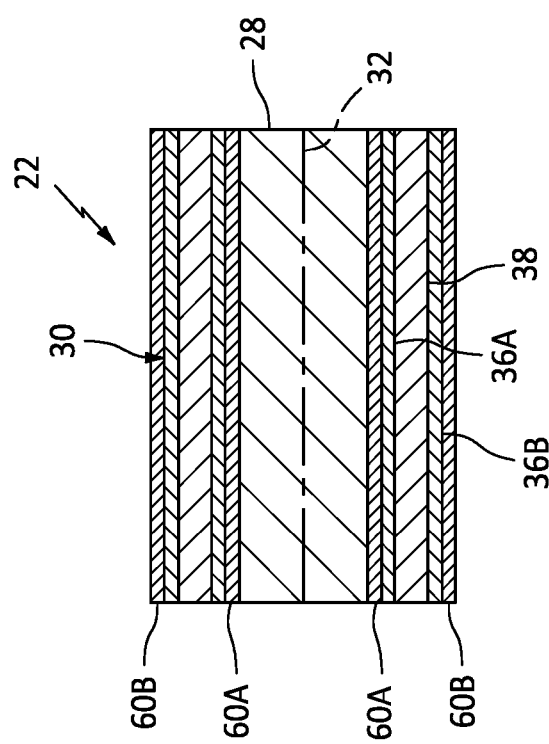
FIGS. 6A-C are sectional illustrations of a portion of the electric cable with various conductor insulation configurations.
Figure 6B:
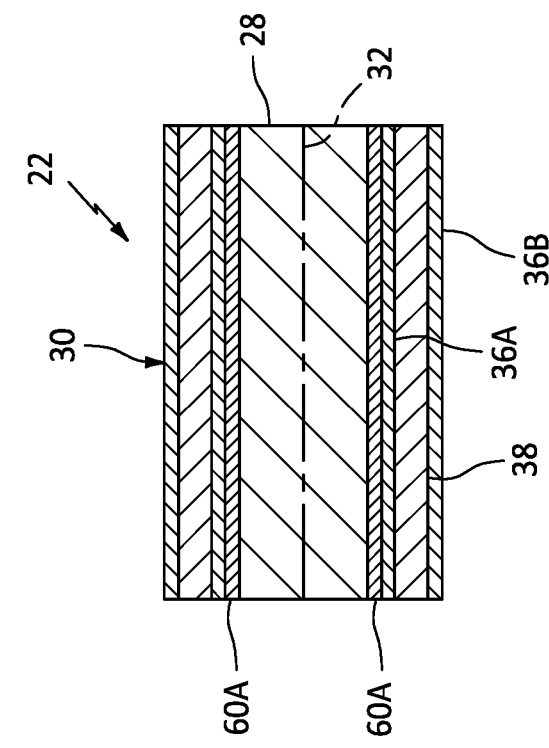
Figure 6C:
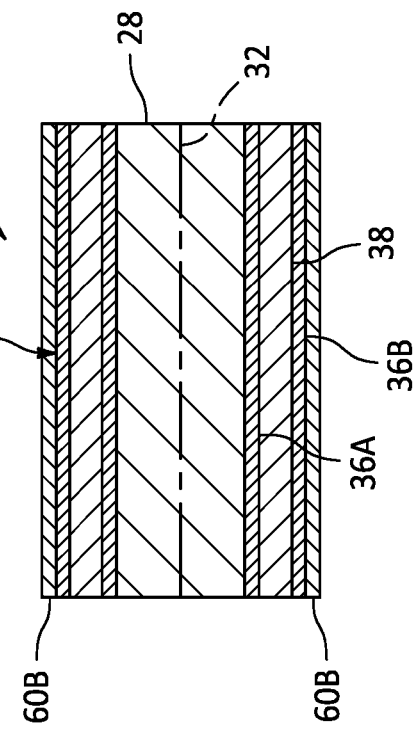

In some embodiments, referring to FIGS. 2 and 3, the electric cable 22 may be configured without insulation discrete from the fiber optic system 30. The fiber optic core 38, for example, may be configured as an electrically insulative sheath for the electric conductor 28. In other embodiments, referring to FIGS. 6A, 6B and 6C, the electric cable 22 may also be configured with electrical insulation 60A and 60B (generally referred to as "60"). For example, referring to FIGS. 6A and 6B, the electric cable 22 may include the inner insulation 60A. This inner insulation 60A may extend longitudinally along and circumferentially about (e.g., completely around) the electric conductor 28. The inner insulation 60A of FIGS. 6A and 6B is radially between and may contact the electric conductor 28 and the fiber optic system 30; e.g., the inner cladding 36A or the fiber optic core 38 where the inner cladding 36A is omitted. Referring to FIGS. 6A and 6C, the electric cable 22 may also or alternatively include the outer insulation 60B. This outer insulation 60B may extend longitudinally along and circumferentially about (e.g., completely around) the fiber optic system 30. The outer insulation 60B of FIGS. 6A and 6C is radially adjacent and outboard of and may contact the fiber optic system 30; e.g., the outer cladding 36B or the fiber optic core 38 where the outer cladding 36B is omitted.

The inner insulation 60A and/or the outer insulation 60B may be configured from or otherwise include electrically insulative (e.g., non-conductive) material. For example, the inner insulation 60A/the outer insulation 60B may be constructed from a polymer; e.g., non-transparent plastic. The inner insulation 60A/the outer insulation 60B of the present disclosure, however, are not limited to the foregoing exemplary electrically insulative material.

Figure 7:
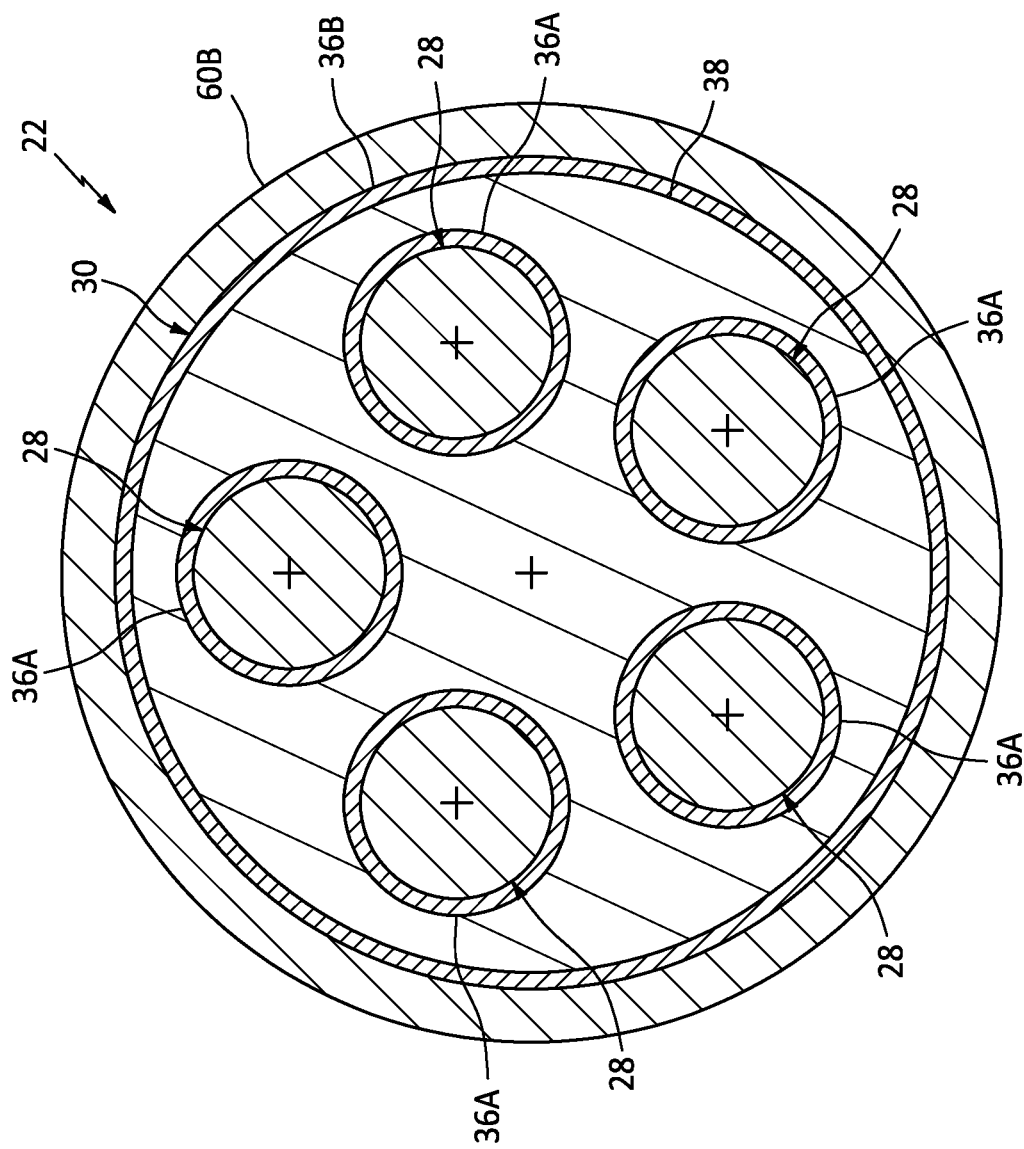
FIG. 7 is a cross-sectional illustration of the electric cable with multiple electric conductors.

In some embodiments, referring to FIGS. 2 and 3, the electric cable 22 may include the single electric conductor 28. In other embodiments, referring to FIG. 7, the electric cable 22 may include a plurality of the electric conductors 28 within (e.g., surrounded by, sheathed by, etc.) the fiber optic system 30. These electric conductors 28 extend longitudinally (e.g., in parallel) within/through the fiber optic system 30. This fiber optic system 30 of FIG. 7 includes a plurality of the inner claddings 36A, the outer cladding 36B and the fiber optic core 38. Each inner cladding 36A extends longitudinally along and circumferentially about (e.g., completely around) a respective one of the electric conductors 28. The fiber optic core 38 may be configured as a matrix in which the electric conductors 28 and the associated inner claddings 36A are disposed. The outer cladding 36B extends longitudinally along and circumferentially about (e.g., completely around) the fiber optic core 38. The electric cable 22 may also include (or be configured without) insulation; e.g., outer insulation 60B extending longitudinally along and circumferentially about the fiber optic system 30.

Figure 8:
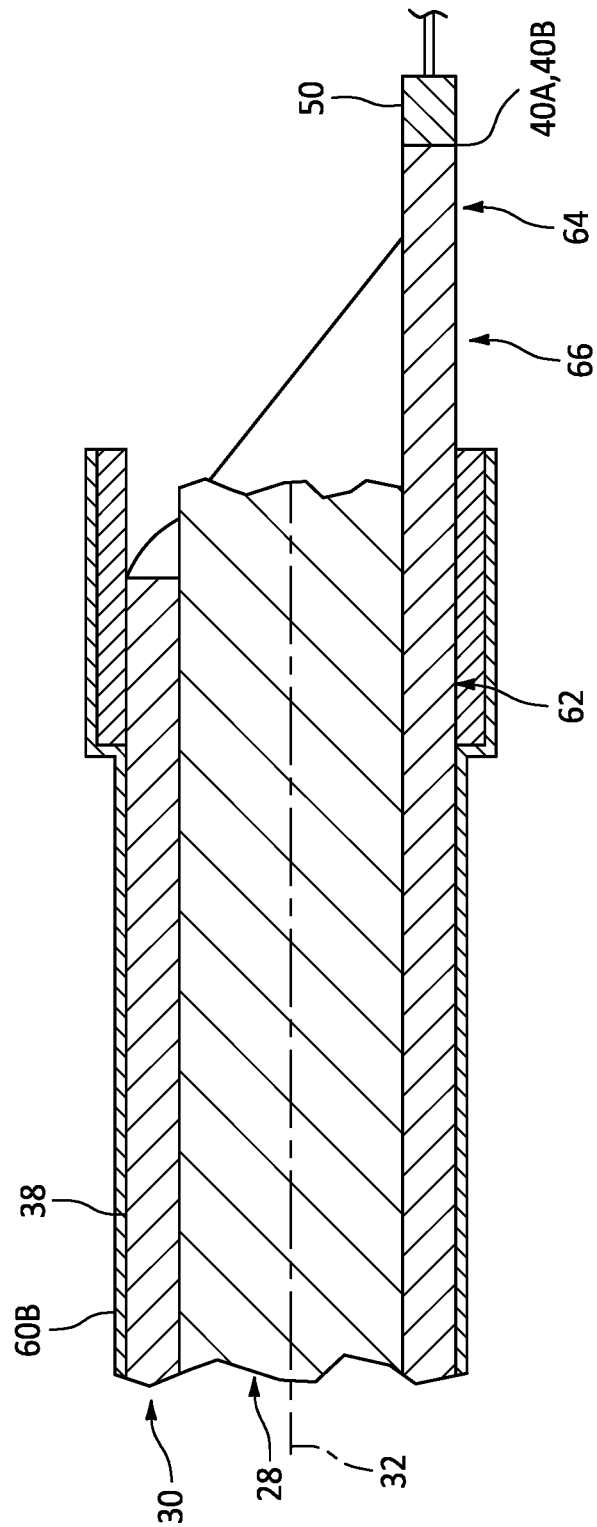
FIG. 8 is a sectional illustration at a coupling between a fiber optic core in the electric cable, and a sensor.

In some embodiments, referring to FIG. 8, the fiber optic core 38 may include a tubular base 62, a (e.g., non-tubular) lead 64 and a transition 66. The base 62 extends longitudinally along and circumferentially about (e.g., completely around) the electric conductor 28. The lead 64 is arranged at one of the optic system ends 40, and is optically coupled to a respective sensor 50. The transition 66 extends longitudinally between and is connected to the base 62 and the lead 64. With this arrangement, the transition 66 may direct all electromagnetic radiation travelling through the base 62 into the lead 64 to the sensor 50 for detection.

Figure 9:
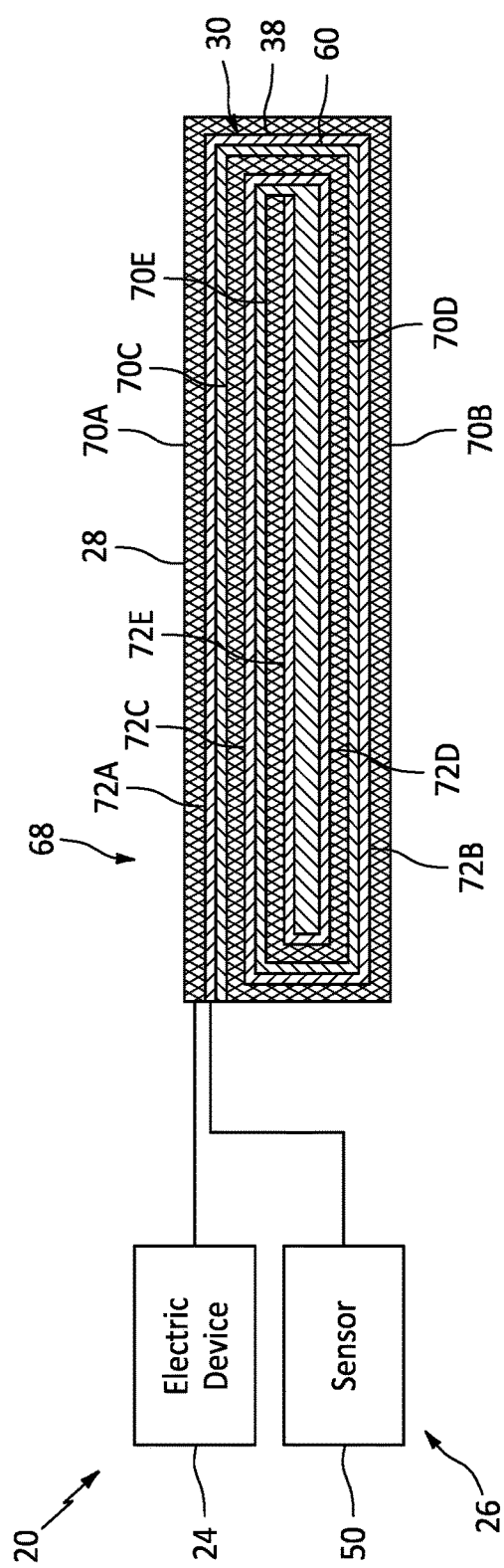
FIG. 9 is a schematic illustration of a portion of the electric apparatus with an electric winding.

In some embodiments, referring to FIG. 9, the electric conductor 28 and the fiber optic system 30 (e.g., the electric cable 22) may be configured as part of an electric winding 68. This electric winding 68 may be part of an electric motor, an electric generator, an electric transformer or any other electric device/system. Within the electric winding 68, the longitudinal centerline and, thus, the electric conductor 28 and the associated fiber optic system 30 may follow a spiral geometry; e.g., a polygonal spiral geometry, a curved spiral geometry, a continuous spiral geometry, an intermittent spiral geometry, etc. The electric conductor 28 may thereby include a plurality of conductor portions 70A-E (generally referred to as "70") disposed along the longitudinal centerline. Each of these conductor portions 70 may longitudinally overlap and extend longitudinally along another one or more or all of the other conductor portions 70. The fiber optic system 30 and, more particularly, its fiber optic core 38 may also include a plurality of core portions 72A-E (generally referred to as "72") disposed along the longitudinal centerline. Each of these core portions 72 may longitudinally overlap and extend longitudinally along another one or more or all of the other core portions 72. Each laterally adjacent pair of the core portions 72 (e.g., 72A and 72C) is separated by a respective one of the conductor portions 70 (e.g., 70C). Similarly, each laterally adjacent pair of the conductor portions 70 (e.g., 70A and 70C) is separated by a respective one of the core portions 72 (e.g., 72A).

Arranging the fiber optic core 38 along the electric conductor 28 within the electric winding 68 facilitates detection of a phase-to-phase short, a phase-to-chassis (e.g., phase-to-ground) short and a phase-to-self short. The term "phase-to-phase short" may describe a short between two adjacent electric windings 68. The term "phase-to-chassis" may describe a short between the electric winding 68 and another conductive element; e.g., a grounded element. The term "phase-to-self short" may describe a short between one portion of the electric winding 68 and another portion of the electric winding 68; e.g., a short within the electric winding 68. By contrast, at least phase-to-self shorts may not be readily observable from an exterior of an electric winding alone, particularly low impedance electric arcs.

Figure 10:
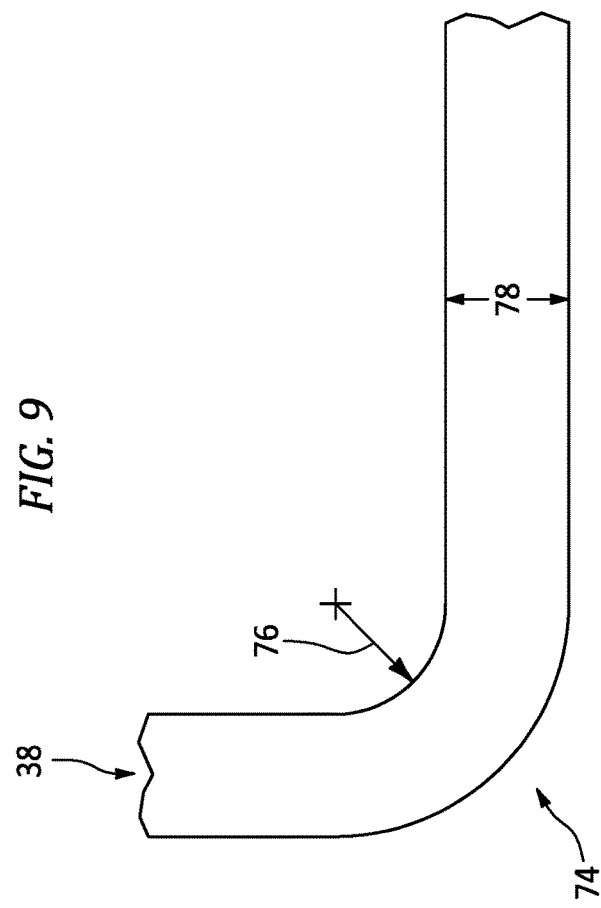
FIG. 10 is a schematic illustration of a portion of the fiber optic core at a bend.

The winding of FIG. 9 is schematically illustrated with sharp bends. However, to facilitate electromagnetic radiation propagation through the fiber optic system 30, at least the fiber optic core 38 may be configured with radiused bend(s) 74 as shown, for example, in FIG. 10. Each bend 74 in the fiber optic core 38 of FIG. 10, for example, may have a (e.g., inner) radius 76 that is at least five times (5×) a lateral thickness 78 of the fiber optic core 38; e.g., between ten times (10×) and twenty times (20×) the core thickness 78. The bend radius 76, of course, may alternatively be greater than twenty times (20×) the core thickness 78.

Figure 11B:
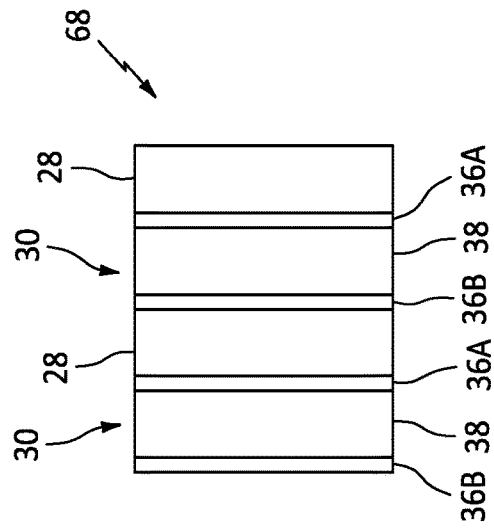
FIGS. 11A-D are sectional illustrations of a portion of the electric winding with various fiber optic cladding configurations.
Figure 11D:
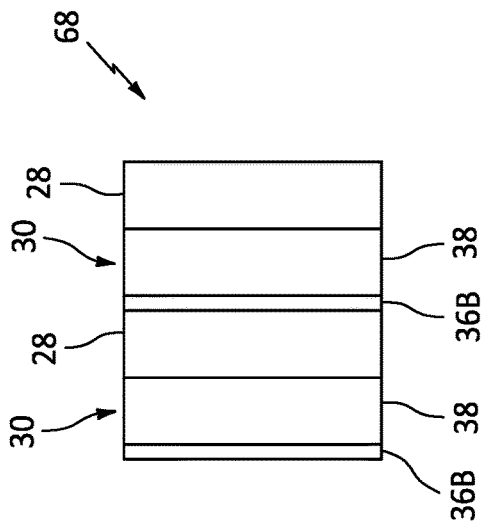
Figure 11A:
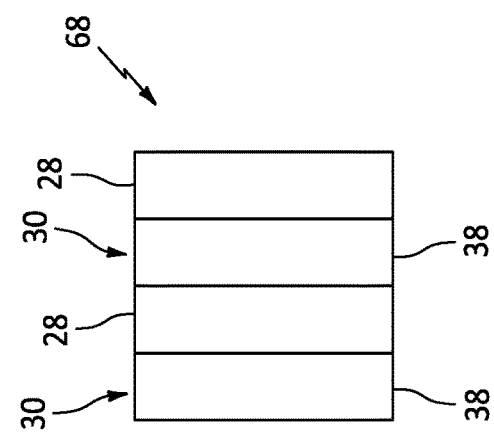
Figure 11C:
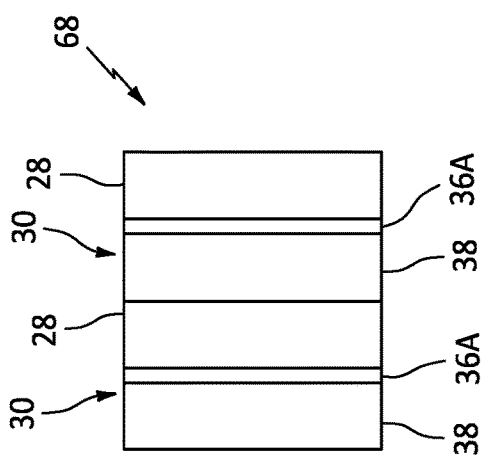

In some embodiments, referring to FIG. 11A, the fiber optic system 30 may be configured without the inner cladding 36A or the outer cladding 36B. In other embodiments, referring to FIGS. 11B, 11C and 11D, the fiber optic system 30 may be configured with one or more of the claddings 36. For example, referring to FIGS. 11B and 11C, the fiber optic system 30 includes the inner cladding 36A; e.g., a laterally interior cladding. Referring to FIGS. 11B and 11D, the fiber optic system 30 may also or alternatively include the outer cladding 36B; e.g., a laterally exterior cladding.

Figure 12B:
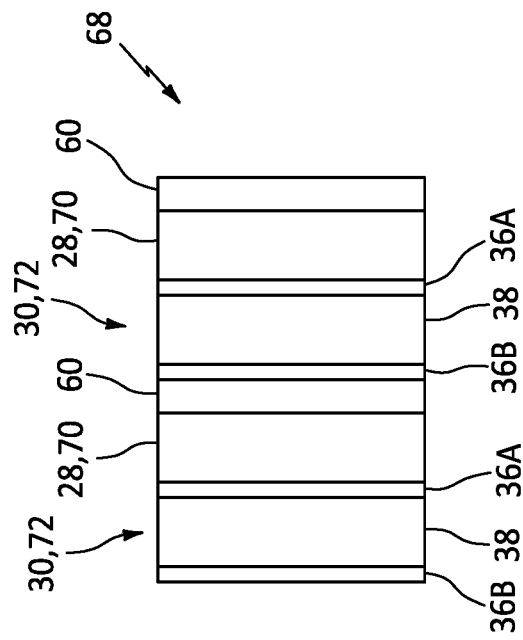
FIGS. 12A and 12B are sectional illustration of a portion of the electric winding with various conductor insulation configurations.
Figure 12A:
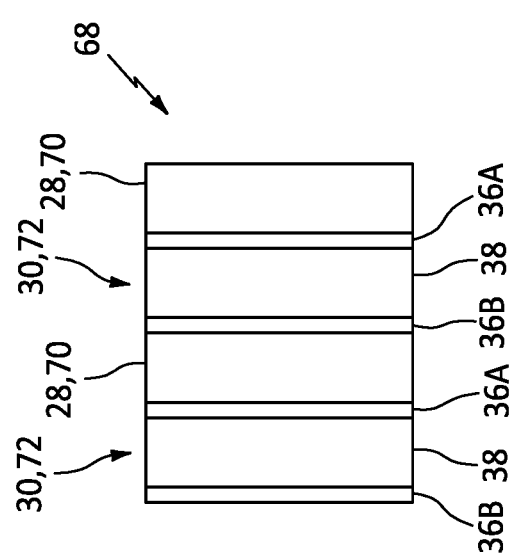

In some embodiments, referring to FIG. 12A, the fiber optic core 38 may provide the electrical insulation between adjacent conductor portions 70. In other embodiments, referring to FIG. 12B, the electric winding 68 may also include insulation 60 where the fiber optic system 30 may be between the electric conductor 28 and the insulation 60.

Figure 13:
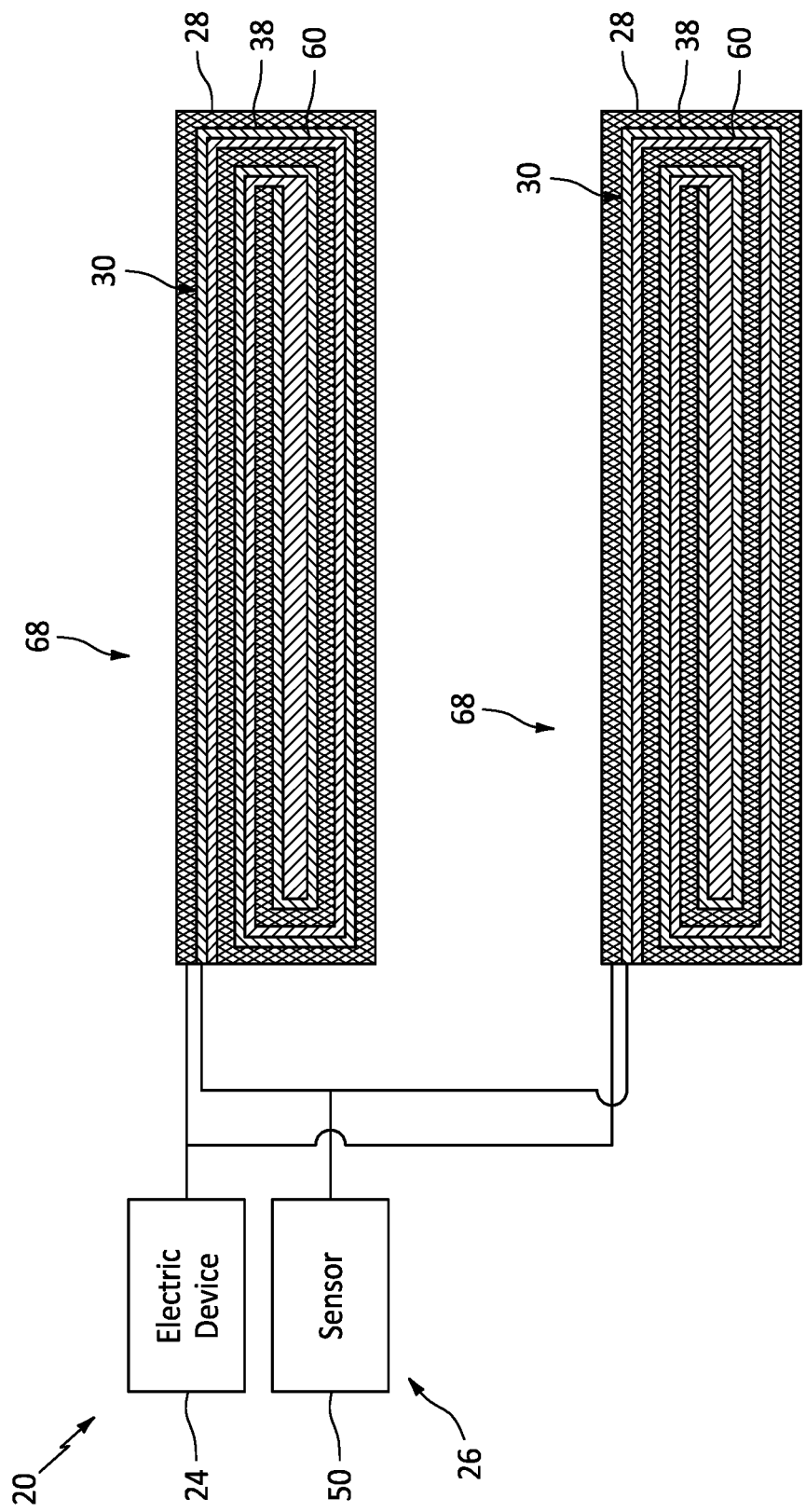
FIG. 13 is a schematic illustration of a portion of the electric apparatus with multiple electric windings.

In some embodiments, referring to FIG. 9, the fiber optic core 38 for each electric winding 68 may be optically coupled with a respective sensor 50. In other embodiments, referring to FIG. 13, multiple fiber optic cores 38 for multiple electric windings 68 may be optically coupled with a common sensor 50.

While various embodiments of the present disclosure have been described, it will be apparent to those of ordinary skill in the art that many more embodiments and implementations are possible within the scope of the disclosure. For example, the present disclosure as described herein includes several aspects and embodiments that include particular features. Although these features may be described individually, it is within the scope of the present disclosure that some or all of these features may be combined with any one of the aspects and remain within the scope of the disclosure. Accordingly, the present disclosure is not to be restricted except in light of the attached claims and their equivalents.

What is claimed is:

1. An electric apparatus, comprising:
    a fiber optic system including an inner cladding, an outer cladding and a fiber optic core between the inner cladding and the outer cladding; and
    an electric conductor extending longitudinally along a centerline within the fiber optic system, wherein the centerline is a centerline of at least one of the inner cladding, the outer cladding, the fiber optic core or the electric conductor,
    wherein:
    the inner cladding extends longitudinally along and circumferentially completely around the electric conductor,
    the fiber optic core cylindrically extends longitudinally along and circumferentially completely around the inner cladding along an entire length of the inner cladding, and
    the outer cladding extends longitudinally along and circumferentially completely around the fiber optic core.

2. The electric apparatus of claim 1, wherein ends of the fiber optic system are recessed from corresponding ends of the electric conductor.

3. The electric apparatus of claim 1, wherein the electric conductor has a circular cross-sectional geometry perpendicular to the centerline.

4. The electric apparatus of claim 1, wherein the electric conductor has a non-circular cross-sectional geometry perpendicular to the centerline.

5. The electric apparatus of claim 1, further comprising insulation extending longitudinally along and circumferentially around the fiber optic system.

6. The electric apparatus of claim 1, further comprising insulation extending longitudinally along and circumferentially around the electric conductor, and the insulation between the electric conductor and the fiber optic system.

7. The electric apparatus of claim 1, further comprising a second electric conductor extending longitudinally within the fiber optic system.

8. The electric apparatus of claim 7, wherein
the inner cladding extends longitudinally along and circumferentially completely around the electric conductor; and
the fiber optic system further includes a second inner cladding, and the second inner cladding extends longitudinally along and circumferentially completely around the second electric conductor.

9. The electric apparatus of claim 1, further comprising a sensor configured to detect electromagnetic radiation traveling through the fiber optic core,
the sensor being configured to detect electromagnetic radiation traveling from the electric conductor, radially through the inner cladding and axially through the fiber optic core resulting from an electric arc at any location of the electric conductor due to a defect in the inner cladding at that axial location.

10. The electric apparatus of claim 9, further comprising a monitor in communication with the sensor, the monitor configured to detect the electric arc with the electric conductor based on detection of the electromagnetic radiation by the sensor, wherein the electromagnetic radiation is generated by the electric arc.

11. The electric apparatus of claim 9, wherein
the fiber optic core comprises a tubular base, a lead and a transition that tapers from the tubular base to the lead; and
the sensor is optically coupled to the fiber optic core through the lead.

12. The electric apparatus of claim 1, further comprising:
a first electric device; and
a second electric device electrically coupled to the first electric device through the electric conductor.

13. The electric apparatus of claim 1, further comprising an electric winding comprising the electric conductor.

14. An electric apparatus, comprising:
an electric conductor extending longitudinally along a centerline; and
a fiber optic system including a fiber optic core, insulation, inner cladding between the fiber optic core and the electric conductor and outer cladding,
the insulation extending longitudinally along and circumferentially around the electric conductor,
the inner cladding extending longitudinally along and circumferentially completely around the electric conductor and the insulation,
the fiber optic core extends longitudinally along and circumferentially completely around the inner cladding along an entire length of the inner cladding,
the outer cladding extends longitudinally along and circumferentially completely around the fiber optic core, and
wherein the centerline is a centerline of at least one of the electric conductor, the fiber optic core or the cladding and the electric apparatus further comprises:
first and second electric devices electrically coupled through the electric conductor; and
a sensor configured to detect electromagnetic radiation traveling from the electric conductor, radially through the insulation and the inner cladding and axially through the fiber optic core resulting from arcing at any axial location of the electric conductor due to a defect in one of the inner cladding and the insulation at that axial location.

15. An electric apparatus, comprising:
an electric winding comprising an electric conductor, insulation, inner cladding and a fiber optic core;
first and second electric devices electrically coupled through the electric conductor;
a sensor; and
a monitor,
the electric conductor extending longitudinally along a centerline with a spiral geometry,
the fiber optic core extending longitudinally along and circumferentially completely around the electric conductor, the insulation and the inner cladding and along an entire length of the electric conductor, the insulation and the inner cladding,
the sensor being configured to detect electromagnetic radiation traveling radially through the insulation and the inner cladding and axially through the fiber optic core, the electromagnetic radiation generated by an electric arc at any axial location of the electric conductor, and
the monitor being in communication with the sensor and configured to detect the electric arc based on detection of the electromagnetic radiation by the sensor.

16. The electric apparatus of claim 15, wherein
the electric conductor comprises a first conductor portion and a second conductor portion longitudinally overlapping the first conductor portion; and
the fiber optic core comprises a first core portion between and longitudinally overlapping the first conductor portion and the second conductor portion.

* * * * *